United States Patent
Furuhata (10) Patent No.: US 9,412,738 B2
(45) Date of Patent: Aug. 9, 2016

(54) SEMICONDUCTOR DEVICE (71) Applicant: SEIKO EPSON CORPORATION, Tokyo (JP)

(72) Inventor: Tomoyuki Furuhata, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/677,396

(22) Filed: Apr. 2, 2015

(65) Prior Publication Data
US 2015/0287719 A1  Oct. 8, 2015

(30) Foreign Application Priority Data

Apr. 7, 2014 (JP) ................. 2014-078333

(51) Int. Cl.
| | | |
|---|---|---|
| H01L 29/66 | (2006.01) | |
| H01L 27/088 | (2006.01) | |
| H01L 29/78 | (2006.01) | |
| H01L 29/36 | (2006.01) | |
| H01L 29/06 | (2006.01) | |
| H01L 21/8238 | (2006.01) | |
| H01L 27/092 | (2006.01) | |
| H01L 21/8234 | (2006.01) | |

(52) U.S. Cl.
CPC ...... *H01L 27/088* (2013.01); *H01L 21/823892* (2013.01); *H01L 27/092* (2013.01); *H01L 29/0696* (2013.01); *H01L 29/36* (2013.01); *H01L 29/7816* (2013.01); *H01L 21/823493* (2013.01)

(58) Field of Classification Search
CPC ...................................... H01L 27/088
USPC ........................................... 257/337
See application file for complete search history.

(56) References Cited

U.S. PATENT DOCUMENTS

| | | | |
|---|---|---|---|
| 5,668,755 A | 9/1997 | Hidaka | |
| 6,864,543 B2 | 3/2005 | Kaneko et al. | |
| 2014/0287573 A1* | 9/2014 | Furuhata | H01L 21/265 438/526 |

FOREIGN PATENT DOCUMENTS

| | | |
|---|---|---|
| JP | H07-335837 A | 12/1995 |
| JP | H09-055483 A | 2/1997 |
| JP | 2003-060071 A | 2/2003 |
| JP | 2003-197790 A | 7/2003 |
| JP | 2008-270367 A | 11/2008 |

* cited by examiner

*Primary Examiner* — Anthony Ho
(74) *Attorney, Agent, or Firm* — Oliff PLC (57) ABSTRACT

A semiconductor device includes a semiconductor substrate of a first conductivity type, an impurity layer of a second conductivity type provided within the semiconductor substrate, an impurity region of the second conductivity type that is connected, within the semiconductor substrate, to the impurity layer, and separates a first region of the semiconductor substrate from a second region by surrounding the first region of the semiconductor substrate together with the impurity layer, a first well and second well of the second conductivity type that are provided on the impurity layer via at least a semiconductor layer of the first conductivity type, and a plurality of transistors provided to the semiconductor substrate.

12 Claims, 4 Drawing Sheets

SEMICONDUCTOR DEVICE

CROSS REFERENCE

The entire disclosure of Japanese Patent Application No. 2014-078333, filed Apr. 7, 2014, is expressly incorporated by reference herein.

BACKGROUND

1. Technical Field

The present invention relates to a semiconductor device or the like in which a plurality of MOS (Metal Oxide Semiconductor) field-effect transistors or LD (Lateral Double-diffused) MOS field-effect transistors are provided together on the same substrate.

2. Related Art

Generally, in the case of constituting an electronic circuit by providing a plurality of MOS field-effect transistors or LDMOS field-effect transistors together on the same semiconductor substrate, the potential of a semiconductor substrate of a first conductivity type is taken as a reference potential (0V), and a potential that is either positive or negative relative to the reference potential is supplied to wells of a second conductivity type in which the transistors are formed.

For example, in the case where a P-type semiconductor substrate is used, the potential of the P-type semiconductor substrate is taken as the reference potential (0V), and a positive potential is supplied to an N-well provided in the P-type semiconductor substrate to reverse bias the P-N junction. Current can thereby be prevented from flowing toward the N-well from the P-type semiconductor substrate. Also, in the case where a plurality of N-wells are provided within the P-type semiconductor substrate, it is possible to supply respectively different potentials to the plurality of N-wells, but these potentials must be positive potentials.

As related technology, JP-A-2003-60071 (paras. 0018-0020, FIG. 1) discloses a semiconductor integrated circuit device having an SRAM that is able to reduce the number of grounding taps per cell, while providing a buried impurity layer as a countermeasure against alpha-ray soft error. This semiconductor integrated circuit device includes a buried impurity layer of the second conductivity type arranged as an intermediate layer in a semiconductor substrate of the first conductivity type, a well region of the first conductivity type provided with a predetermined depth in the semiconductor substrate without contacting the buried impurity layer, a well region of the second conductivity type provided with a predetermined depth in the semiconductor substrate without contacting the buried impurity layer, and an integrated circuit element provided in the first conductivity type well region and an integrated circuit element provided in the second conductivity type well region that relate to each other.

Referring to FIG. 1 of JP-A-2003-60071, a ground potential VSS is supplied to a P-type semiconductor substrate that is located between an N-type buried impurity layer and P-well and N-well regions. The P-well region can thereby be prevented from floating, in a state where the buried impurity layer is provided as countermeasure against soft error. On the other hand, a positive power potential VDD is supplied to the N-well region. Accordingly, the transistors that are formed in the P-well region and the N-well region operate in a voltage range between the ground potential VSS and the power potential VDD.

However, there are cases where a transistor that operates in a voltage range at or above the reference potential and a transistor that operates in a voltage range at or below the reference potential are both used, depending on the electronic circuit. In such cases, it is desirable to constitute the electronic circuit by providing both transistors together on the same semiconductor substrate.

SUMMARY

An advantage of some aspects of the invention is to provide a semiconductor device or the like in which both a transistor that operates in a voltage range at or above a reference potential and a transistor that operates in a voltage range at or below the reference potential are provided together on the same semiconductor substrate.

A semiconductor device according to one aspect of the invention includes a semiconductor substrate of a first conductivity type, an impurity layer of a second conductivity type provided within the semiconductor substrate, an impurity region of the second conductivity type that is connected, within the semiconductor substrate, to the impurity layer, and separates a first region of the semiconductor substrate from a second region by surrounding the first region of the semiconductor substrate together with the impurity layer, a first well and second well of the second conductivity type that are provided, within the first region of the semiconductor substrate, on the impurity layer via at least a semiconductor layer of the first conductivity type, and a plurality of transistors provided to the semiconductor substrate. In this specification, the first conductivity type may be the P-type and the second conductivity type may be the N-type, or the first conductivity type may be the N-type and the second conductivity type may be the P-type.

According to the above aspect of the invention, within the first conductivity type semiconductor substrate, the first region of the semiconductor substrate is electrically separated from the second region, by providing the second conductivity type impurity layer and impurity region that surround the first region of the semiconductor substrate. Accordingly, a different potential from the potential of the second region of the semiconductor substrate can be set for the first region, and the range of potentials that can be set for the first and second N-wells within the first region can be expanded. As a result, it is possible to provide both a transistor that operates in a voltage range at or above the reference potential and a transistor that operates in a voltage range at or below the reference potential together on the same semiconductor substrate.

Here, a configuration may be adopted in which the semiconductor device is further provided with a first terminal that supplies a potential to the first region of the semiconductor substrate, and a second terminal that supplies a potential to the second region of the semiconductor substrate. Different potentials can thereby be supplied to the first and second regions of the semiconductor substrate from outside the semiconductor device via the first and second terminals.

In this case, a configuration may be adopted in which the semiconductor device is further provided with a third terminal that supplies a potential to the impurity region and the impurity layer, or a fourth terminal that supplies a potential to the first or second well. A desired potential can thereby be supplied to the impurity region and the impurity layer or to the first or second well from outside the semiconductor device via the third or fourth terminal.

Also, a configuration may be adopted in which the semiconductor device is further provided with a third well of the first conductivity type provided, within the first region of the semiconductor substrate, on the impurity layer via at least the first conductivity type semiconductor layer. For example, leakage current between the plurality of transistors provided in these wells can be reduced by arranging second conductivity type wells and first conductivity type wells alternately.

In this case, a configuration may be adopted in which the first terminal is electrically connected to the third well, and a potential is supplied from the first terminal to the first region of the semiconductor substrate via the third well. An interconnect that is electrically connected to the first region of the semiconductor substrate can thereby be omitted.

In the above, a configuration may be adopted in which a reference potential is supplied to the second region of the semiconductor substrate of a P-type, a first potential that is greater than or equal to the reference potential is supplied to the impurity region and impurity layer of an N-type, a second potential that is less than the first potential is supplied to the first region of the P-type semiconductor substrate, and a potential that is greater than the second potential is supplied to the first and second wells of the N-type. The P-N junctions within the semiconductor substrate are thereby reverse biased, and unnecessary current can be prevented from flowing in the P-N junctions.

In this case, a configuration may be adopted in which a second potential that is less than the reference potential is supplied to the first region of the P-type semiconductor substrate. This enables an N-channel transistor that operates in a voltage range at or below the reference potential to be provided in the first region, and an N-channel transistor that operates in a voltage range at or above the reference potential to be provided in the second region.

Also, a configuration may be adopted in which a potential that is greater than the reference potential is supplied to the N-type first well, and a potential that is less than or equal to the reference potential is supplied to the N-type second well. This enables a P-channel transistor that operates in a voltage range at or above the reference potential to be provided in the first N-well, and a P-channel transistor that operates in a voltage range at or below the reference potential to be provided in the second N-well.

In the above, a configuration may be adopted in which the first conductivity type semiconductor layer within the first region of the semiconductor substrate includes a second impurity layer of the first conductivity type that is provided on the impurity layer and contacts at least the first and second wells. Leakage current within the first region of the semiconductor substrate can thereby be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. Note that the same reference numerals are given to constituent elements that are the same, and redundant description will be omitted.

Figure 1:
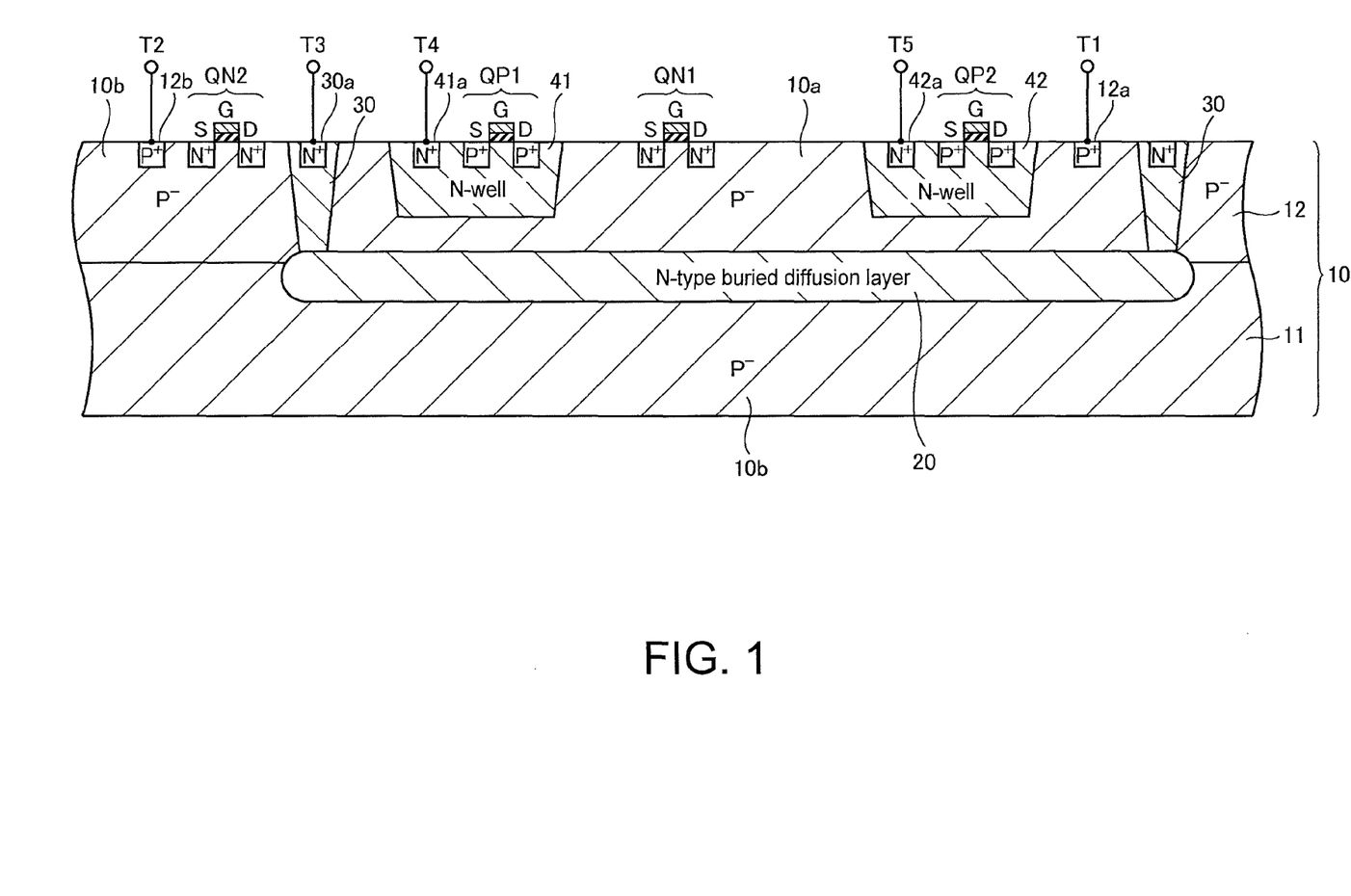
FIG. 1 is a cross-sectional schematic view showing a main part of a semiconductor device according to one embodiment.

FIG. 1 is a cross-sectional schematic view showing a main part of a semiconductor device according to one embodiment. As shown in FIG. 1, this semiconductor device includes a P-type semiconductor substrate 10, an N-type buried diffusion layer 20, an N-type impurity diffusion region (N-plug) 30 and N-wells 41 and 42 provided within the semiconductor substrate 10, and a plurality of transistors QN1, QN2, QP1 and QP2 provided to the semiconductor substrate 10.

For example, the semiconductor substrate 10 includes a P-type base substrate 11 in which the N-type buried diffusion layer 20 is provided by implanting N-type impurities into a surface part thereof, and a P-type epitaxial layer 12 provided by epitaxially growing a P-type semiconductor on the base substrate 11. Here, the epitaxial layer 12 serves as an element formation region in which elements such as transistors are formed. Silicon (Si), for example, is used as the material of the base substrate 11 and the epitaxial layer 12. Alternatively, the diffusion layer 20 may be arranged at a predetermined depth within the semiconductor substrate 10 by forming a deep well within the semiconductor substrate 10, and the epitaxial layer 12 may be omitted.

The N-plug 30 is connected, within the semiconductor substrate 10, to the N-type buried diffusion layer 20, and separates a first region 10a of the semiconductor substrate from a second region 10b by surrounding the first region 10a of the semiconductor substrate together with the N-type buried diffusion layer 20. The N-wells 41 and 42 are provided, within the first region 10a of the semiconductor substrate, on the N-type buried diffusion layer 20 via at least a P-type semiconductor layer.

An N-channel MOS field-effect transistor QN1 is provided in the first region 10a of the semiconductor substrate, and an N-channel MOS field-effect transistor QN2 is provided in the second region 10b of the semiconductor substrate. The transistors QN1 and QN2 each have an N-type source region (S) and drain region (D) provided within the semiconductor substrate and a gate electrode (G) provided on the semiconductor substrate via a gate insulating film.

A P-channel MOS field-effect transistor QP1 is provided in the N-well 41, and a P-channel MOS field-effect transistor QP2 is provided in the N-well 42. The transistors QP1 and QP2 each have a P-type source region (S) and drain region (D) provided within the N-well and a gate electrode (G) provided on the N-well via a gate insulating film.

Also, the semiconductor device may include power terminals (pads) T1 to T5. The power terminal T1 is electrically connected to a P-type contact region 12a provided within the first region 10a of the semiconductor substrate, and supplies a potential to the first region 10a of the semiconductor substrate. The power terminal T2 is electrically connected to a P-type contact region 12b provided within the second region 10b of the semiconductor substrate, and supplies a potential to the second region 10b of the semiconductor substrate. Different potentials can thereby be supplied to the first region 10a and the second region 10b of the semiconductor substrate from outside the semiconductor device via the power terminals T1 and T2.

The power terminal T3 is electrically connected to an N-type contact region 30a provided within the N-plug 30, and supplies a potential to the N-plug 30 and the N-type buried diffusion layer 20. A desired potential can thereby be supplied to the N-plug 30 and the N-type buried diffusion layer 20 from outside the semiconductor device via the power terminal T3. Note that in the case where the potential that is supplied to the N-plug 30 is the same as the potential that is supplied to the second region 10b of the semiconductor substrate, the power terminal T3 may be omitted by electrically connecting the contact region 30a to the power terminal T2.

The power terminal T4 is electrically connected to an N-type contact region 41a provided within the N-well 41, and supplies a potential to the N-well 41. Also, the power terminal T5 is electrically connected to an N-type contact region 42a provided within the N-well 42, and supplies a potential to the N-well 42.

A desired potential can thereby be supplied to the N-wells 41 and 42 from outside the semiconductor device via the power terminals T4 and T5. Note that in the case where the potential that is supplied to the N-well 41 or the N-well 42 is the same as the potential that is supplied to the N-plug 30, the power terminal T4 or T5 may be omitted by electrically connecting the contact region 41a or 42a to the power terminal T3.

Next, exemplary potentials that are supplied to respective parts of the semiconductor device shown in FIG. 1 will be described. By applying a reference potential (0V) to the power terminal T2, the reference potential is supplied to the second region 10b of the semiconductor substrate from the power terminal T2. By applying a first potential (e.g., +5V) that is greater than or equal to the reference potential to the power terminal T3, the first potential is supplied to the N-plug 30 and the N-type buried diffusion layer 20 from the power terminal T3. By applying a second potential (e.g., −5V) that is less than the first potential to the power terminal T1, the second potential is supplied to the first region 10a of the semiconductor substrate from the power terminal T1.

Also, by applying a third potential (e.g., +5V) that is greater than the second potential to the power terminal T4, the third potential is supplied to the N-well from the power terminal T4. By applying a fourth potential (e.g., 0V) that is greater than the second potential to the power terminal T5, the fourth potential is supplied to the N-well 42 from the power terminal T5. The P-N junctions within the semiconductor substrate are thereby reverse biased, and unnecessary current can be prevented from flowing in the P-N junctions.

In the above example, a second potential (−5V) that is less than the reference potential is supplied to the first region 10a of the semiconductor substrate. In this case, a potential that is greater than or equal to the second potential (−5V) can be applied to the source and the drain of the transistor QN1 provided in the first region 10a of the semiconductor substrate. For example, the transistor QN1 operates in a voltage range of 0V to −5V that is less than or equal to the reference potential.

Also, a potential that is greater than or equal to the reference potential (0V) can be applied to the source and the drain of the transistor QN2 provided in the second region 10b of the semiconductor substrate to which the reference potential (0V) is supplied. For example, the transistor QN2 operates in a voltage range of 0V to +5V that is greater than or equal to the reference potential.

In the above example, a third potential (+5V) that is greater than the reference potential is supplied to the N-well 41. In this case, a potential that is less than or equal to the third potential (+5V) can be applied to the source and the drain of the transistor QP1 provided in the N-well 41. For example, the transistor QP1 operates in a voltage range of 0V to +5V that is greater than or equal to the reference potential.

Also, a fourth potential (0V) that is less than or equal to the reference potential is supplied to the N-well 42. In this case, a potential that is less than or equal to the fourth potential (0V) can be applied to the source and the drain of the transistor QP2 provided in the N-well 42. For example, the transistor QP2 operates in a voltage range of 0V to −5V that is less than or equal to the reference potential.

According to the embodiment of FIG. 1, within the P-type semiconductor substrate 10, the first region 10a of the semiconductor substrate is electrically separated from the second region 10b, by providing the N-type buried diffusion layer 20 and the N-plug 30 that surround the first region 10a of the semiconductor substrate. Accordingly, a different potential from the potential of the second region 10b of the semiconductor substrate can be set for the first region 10a, and the range of potentials that can be set for the N-wells 41 and 42 within the first region 10a can be expanded. As a result, it is possible to provide both a transistor that operates in a voltage range at or above the reference potential and a transistor that operates in a voltage range at or below the reference potential together on the same semiconductor substrate. Note that P-wells may be provided in the regions that form the transistors QN1 and/or QN2 to improve the controllability of characteristics such as the threshold voltage of the transistors.

Figure 2:
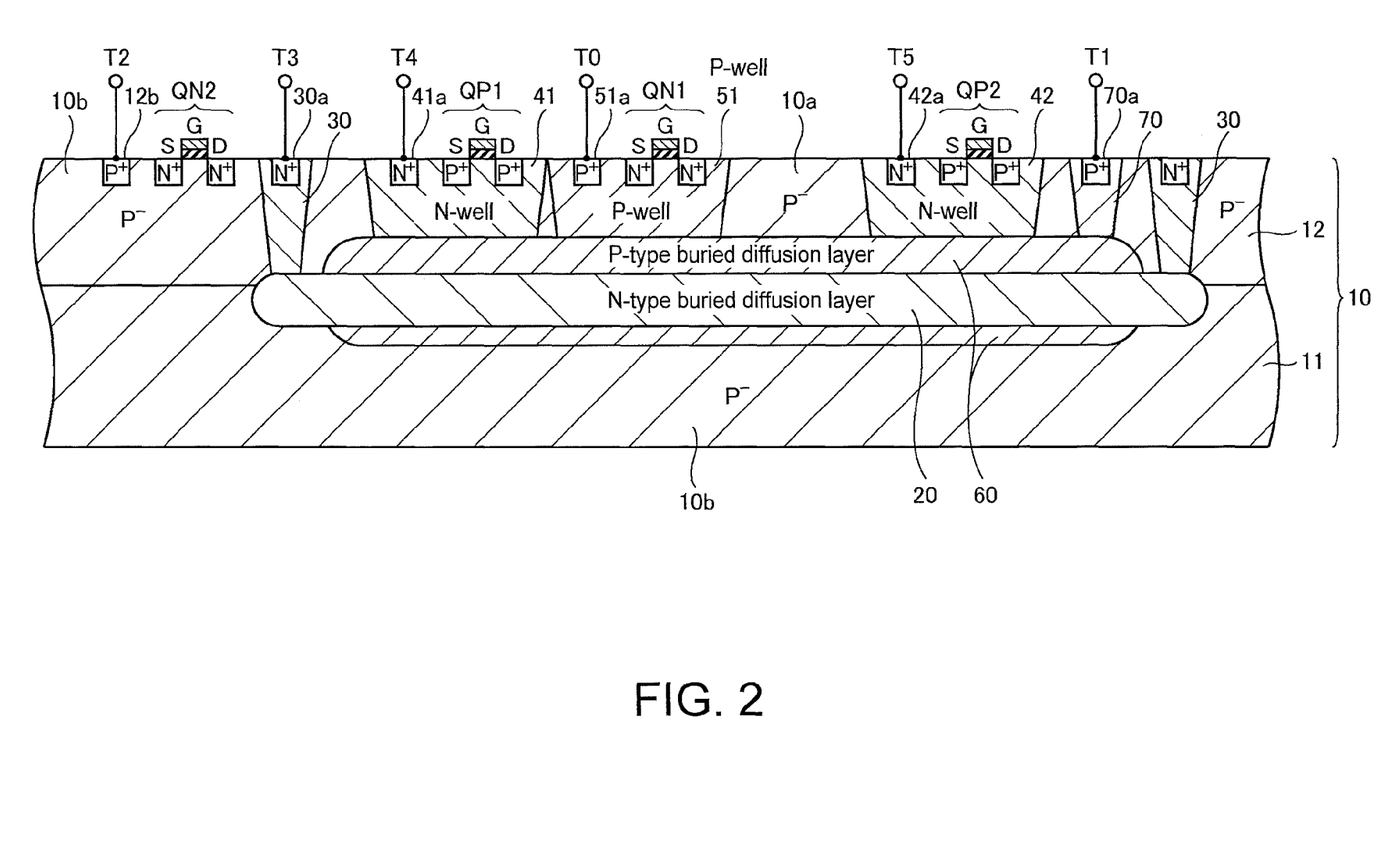
FIG. 2 is a cross-sectional schematic view showing a main part of a semiconductor device according to one embodiment.

FIG. 2 is a cross-sectional schematic view showing a main part of a semiconductor device according to one embodiment. As shown in FIG. 2, this semiconductor device further includes a P-well 51 provided, within the first region 10a of the semiconductor substrate, on the N-type buried diffusion layer 20 via at least a P-type semiconductor layer. The transistor QN1 is thereby provided in the P-well 51. For example, leakage current between the plurality of transistors provided in these wells can be reduced by arranging N-wells and P-wells alternately.

When, in the case where a power terminal T0 that is electrically connected to a P-type contact region 51a provided in the P-well 51 is provided, a potential is applied to the power terminal T0, the potential is supplied to the first region 10a of the semiconductor substrate from the power terminal T0 via the P-well 51. Accordingly, the power terminal T1 (FIG. 1) that supplies a potential directly to the first region 10a of the semiconductor substrate may be omitted. An interconnect that is electrically connected to the first region 10a of the semiconductor substrate can thereby be omitted. On the other hand, in the case where the power terminal T0 is not provided, a potential is supplied to the P-well 51 from the power terminal T1 via the first region 10a of the semiconductor substrate.

Also, as shown in FIG. 2, a configuration may be adopted in which the P-type semiconductor layer within the first region 10a of the semiconductor substrate includes a P-type buried diffusion layer 60 that is provided on the N-type buried diffusion layer 20 and contacts at least the N-wells 41 and 42. Leakage current within the first region 10a of the semiconductor substrate can thereby be reduced. Note that the P-type buried diffusion layer 60 may also be arranged in a deeper region than the N-type buried diffusion layer 20.

The P-type buried diffusion layer 60 also contacts the P-well 51. Accordingly, when a potential is applied to the power terminal T0, the potential is supplied to the P-type buried diffusion layer 60 from the power terminal T0 via the P-well 51. On the other hand, a P-type impurity diffusion region (P-plug) 70 connected to the P-type buried diffusion layer 60 may be provided, and the power terminal T1 may be electrically connected to a P-type contact region 70a provided within the P-plug 70. In this case, when a potential is applied to the power terminal T1, the potential is supplied to the P-well 51 from the power terminal T1 via the P-plug 70 and the P-type buried diffusion layer 60. Accordingly, the power terminal T0 that supplies a potential directly to the P-well 51 may be omitted.

In a semiconductor device according to a the embodiment shown in FIGS. 3A-4B, a plurality of MOS field-effect transistors are provided in a first portion of the semiconductor device, and a plurality of LDMOS field-effect transistors are provided in a second portion of the semiconductor device.

Figure 3A:
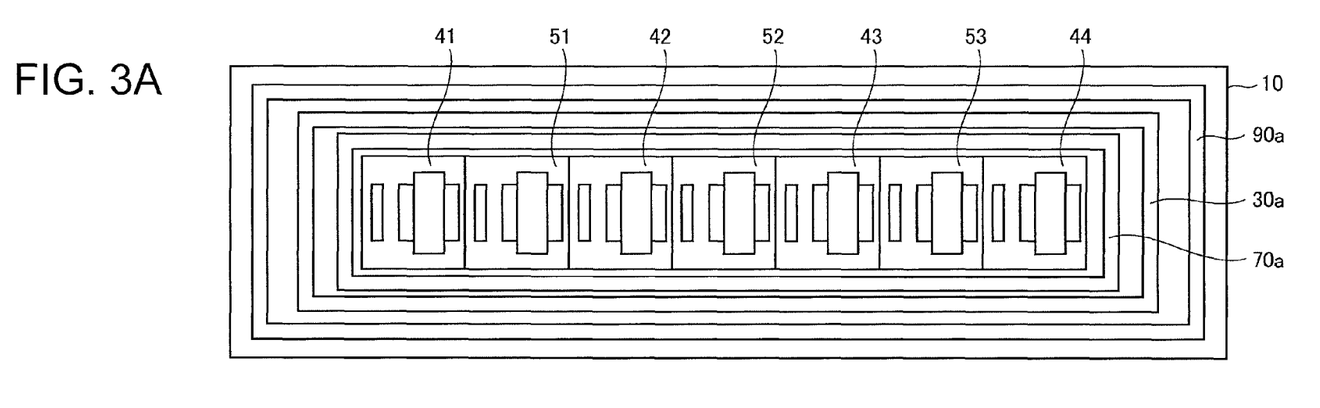
FIG. 3A is a schematic diagram of an above view of a first portion of a semiconductor device according to one embodiment.
Figure 3B:
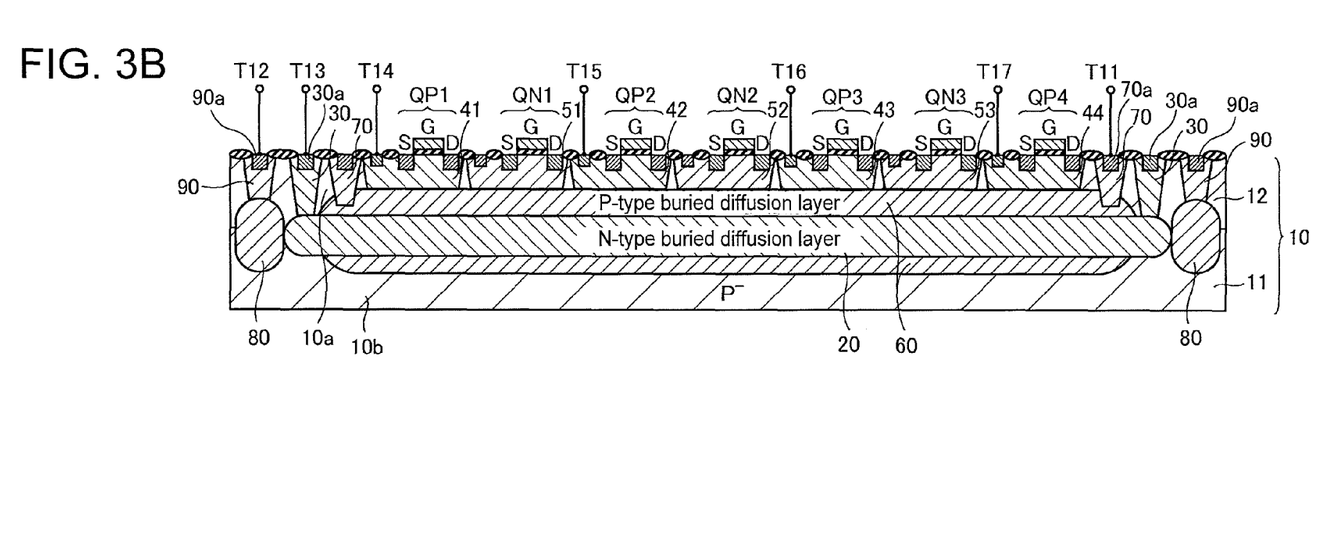
FIG. 3B is a cross-sectional schematic view showing a first portion of a semiconductor device according to the embodiment shown in FIG. 3A.

FIGS. 3A and 3B are schematic diagrams showing the first portion of the semiconductor device. FIG. 3A is a plan view showing the first portion of the semiconductor device, and FIG. 3B is a cross-sectional view showing the first portion of the semiconductor device. In this embodiment, as in FIGS. 1 and 2, the first region 10a of the semiconductor substrate is separated from the second region 10b within semiconductor substrate 10 as a result of the N-type buried diffusion layer 20 and the N-plug 30 surrounding the first region 10a of the semiconductor substrate.

This semiconductor device may also include, in the first region 10a of the semiconductor substrate, a P-type buried diffusion layer 60 that is provided on the N-type buried diffusion layer 20 and contacts N-wells 41 to 44 and P-wells 51 to 53, and a P-type impurity diffusion region (P-plug) 70 connected to the P-type buried diffusion layer 60.

Also, the semiconductor device may include, in the second region 10b of the semiconductor substrate, a P-type buried diffusion layer 80 provided along the outer periphery of the N-plug 30, and a P-type impurity diffusion region (P-plug) 90 connected to the P-type buried diffusion layer 80. In the case where a plurality of N-type buried diffusion layers 20 are provided within the semiconductor substrate 10, leakage current between these N-type buried diffusion layers 20 can thereby be reduced.

This semiconductor device includes, within the first region 10a of the semiconductor substrate, the N-wells 41 to 44 and the P-wells 51 to 53 provided on the N-type buried diffusion layer 20 via the P-type buried diffusion layer 60, P-channel MOS field-effect transistors QP1 to QP4 respectively provided in the N-wells 41 to 44, N-channel MOS field-effect transistors QN1 to QN3 respectively provided in the P-wells 51 to 53, and power terminals T11 to T17.

The power terminal T11 is electrically connected to the P-type contact region 70a provided within the P-plug 70, and supplies a potential to the P-plug 70 and the first region 10a of the semiconductor substrate that includes the P-type buried diffusion layer 60. The potential that is supplied to the P-type buried diffusion layer 60 is also supplied to the P-wells 51 to 53. The power terminal T12 is electrically connected to the P-type contact region 90a provided in the P-plug 90, and supplies a potential to the P-plug 90 and the second region 10b of the semiconductor substrate that includes the P-type buried diffusion layer 80.

The power terminal T13 is electrically connected to the N-type contact region 30a provided in the N-plug 30, and supplies a potential to the N-plug 30 and the N-type buried diffusion layer 20. The power terminals T14 to T17 are respectively electrically connected to the N-type contact regions provided within the N-wells 41 to 44, and supply potentials to the N-wells 41 to 44.

Next, exemplary potentials that are supplied to respective parts of the semiconductor device shown in FIGS. 3A and 3B will be described. By applying a reference potential (0V) to the power terminal T12, the reference potential is supplied to the second region 10b of the semiconductor substrate from the power terminal T12. By applying a first potential (e.g., +2V) that is greater than or equal to the reference potential to the power terminal T13, the first potential is supplied to the N-plug 30 and the N-type buried diffusion layer 20 from the power terminal T13. By applying a second potential (e.g., −8V) that is less than the first potential to the power terminal T11, the second potential is supplied to the first region 10a of the semiconductor substrate from the power terminal T11. The second potential is also supplied to the P-wells 51 to 53.

Also, by applying a third potential (e.g., +5V) that is greater than the second potential to the power terminal T14, the third potential is supplied to the N-well 41 from the power terminal T14. In this case, a potential that is less than or equal to the third potential (+5V) can be applied to the source and the drain of the transistor QP1 provided in the N-well 41. For example, the transistor QP1 operates in a voltage range of 0V to +5V that is greater than or equal to the reference potential.

By applying a fourth potential (e.g., +3V) that is greater than the second potential to the power terminal T15, the fourth potential is supplied to the N-well 42 from the power terminal T15. In this case, a potential that is less than or equal to the fourth potential (+3V) can be applied to the source and the drain of the transistor QP2 provided in the N-well 42. For example, the transistor QP2 operates in a voltage range of 0V to +3V that is greater than or equal to the reference potential.

By applying a fifth potential (e.g., −5V) to the power terminal T16, the fifth potential is supplied to the N-well 43 from the power terminal T16. In this case, a potential that is less than or equal to the fifth potential (−5V) can be applied to the source and the drain of the transistor QP3 provided in the N-well 43. For example, the transistor QP3 operates in a voltage range of −5V to −8V that is less than or equal to the reference potential.

By applying a sixth potential (e.g., −3V) to the power terminal T17, the sixth potential is supplied to the N-well 44 from the power terminal T17. In this case, a potential that is less than or equal to the sixth potential (−3V) can be applied to the source and the drain of the transistor QP4 provided in the N-well 44. For example, the transistor QP4 operates in a voltage range of −3V to −8V that is less than or equal to the reference potential.

Also, a second potential (e.g., −8V) that is less than the first potential is supplied to the P-wells 51 to 53 from the power terminal T11. In this case, potentials that are greater than or equal to the second potential (−8V) can be applied to the sources and the drains of the transistors QN1 to QN3 provided in the P-wells 51 to 53. For example, the transistor QN1 operates in a voltage range of 0V to +5V that is greater than or equal to the reference potential, and the transistor QN2 operates in a voltage range of 0V to +3V that is greater than or equal to the reference potential. Also, the transistor QN3 operates in a voltage range of −5V to −8V that is less than or equal to the reference potential. Note that the voltage range in which the transistors QN1 to QN3 operate need only be greater than or equal to the second potential (−8V), and may be from −3V to −8V.

Figure 4A:
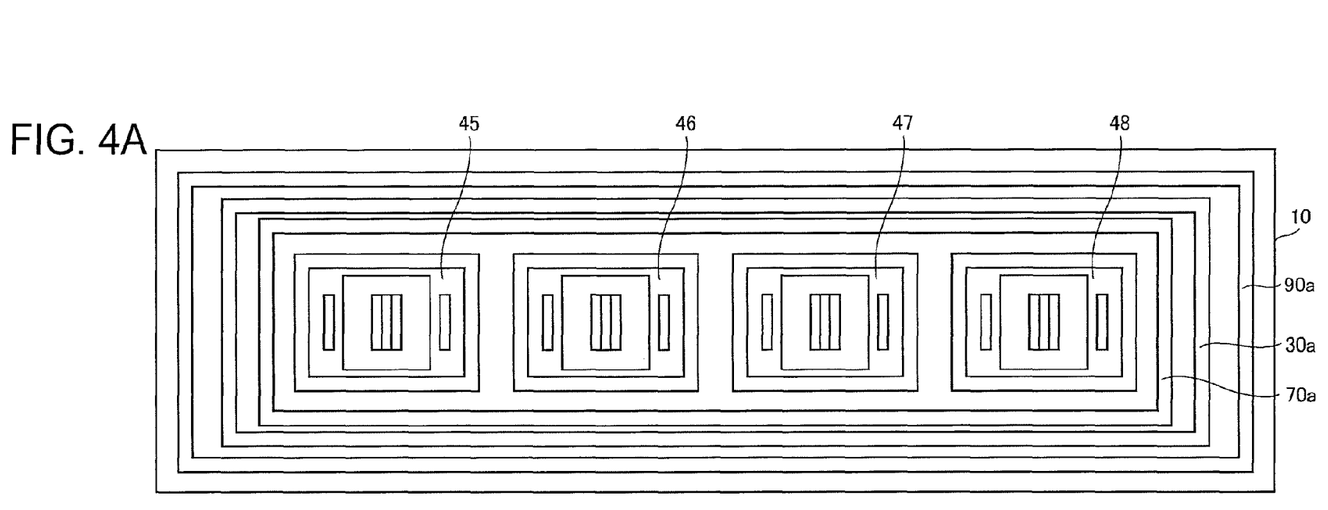
FIG. 4A is a schematic diagram of an above view of a second portion of a semiconductor device according to the embodiment shown in FIG. 3A.
Figure 4B:
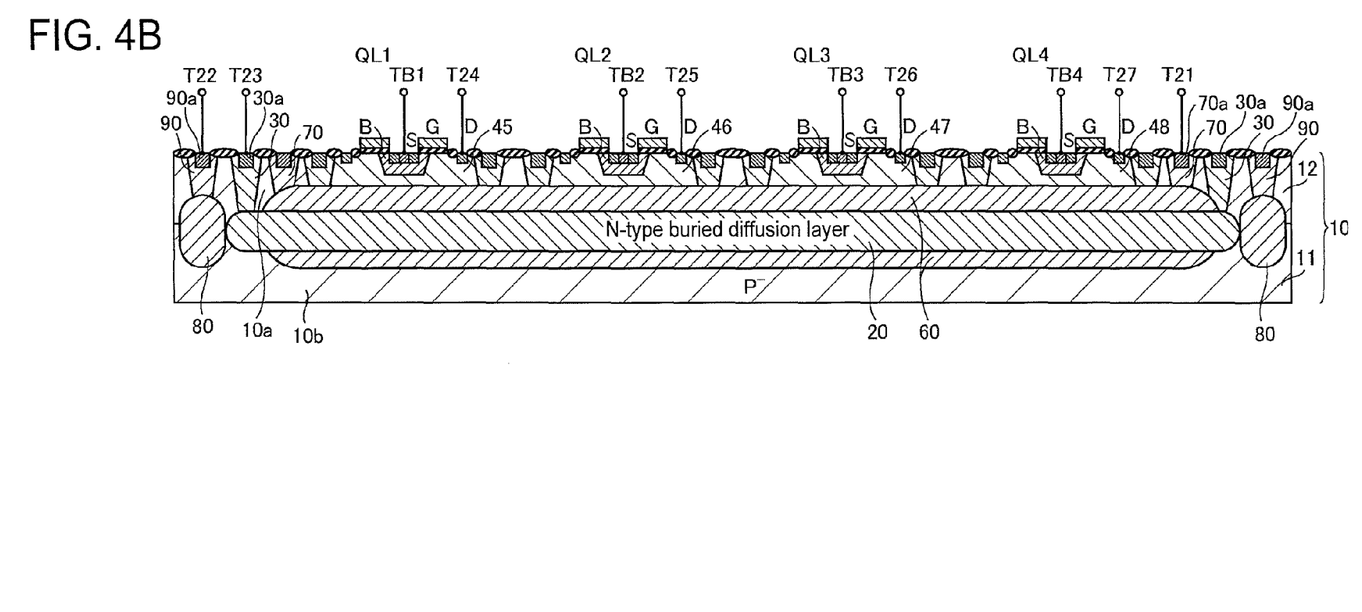
FIG. 4B is a cross-sectional schematic view showing a second portion of a semiconductor device according to the embodiment shown in FIG. 3A.

FIGS. 4A and 4B are schematic diagrams showing the second portion of the semiconductor device according to the embodiment shown in FIGS. 3A and 3B.

FIG. 4A is a plan view showing the second portion of the semiconductor device, and FIG. 4B is a cross-sectional view showing the second portion of the semiconductor device. In the second portion of the semiconductor device, similarly to the first portion, within the semiconductor substrate 10, the first region 10a of the semiconductor substrate is separated from the second region 10b, as a result of the N-type buried diffusion layer 20 and the N-plug 30 surrounding the first region 10a of the semiconductor substrate.

This semiconductor device may also include, in the first region 10a of the semiconductor substrate, a P-type buried diffusion layer 60 that is provided on the N-type buried diffusion layer 20 and contacts N-wells 45 to 48, and a P-type impurity diffusion region (P-plug) 70 connected to the P-type buried diffusion layer 60. Also, the semiconductor device may include, in the second region 10b of the semiconductor substrate, a P-type buried diffusion layer 80 provided along the outer periphery of the N-plug 30, and a P-type impurity diffusion region (P-plug) 90 connected to the P-type buried diffusion layer 80.

This semiconductor device includes, within the first region 10a of the semiconductor substrate, the N-wells 45 to 48 provided on the N-type buried diffusion layer 20 via the P-type buried diffusion layer 60, N-channel LDMOS field-effect transistors QL1 to QL4 respectively provided in the N-wells 45 to 48, power terminals T21 to T27, and body terminals TB1 to TB4.

The transistors QL1 to QL4 each have an N-type drain region (D) and a P-type body region (B) provided within the N-well, an N-type source region (S) provided within the body region (B), a gate insulating film and a field oxide film (also called an "offset insulating film") provided on the N-well, and a gate electrode (G) provided on a portion of the surface of the gate insulating film and the field oxide film.

The film thickness of the field oxide film is greater than the film thickness of the gate insulating film, and the gate electrode (G) is not provided in a region close to the drain region (D) on the surface of the field oxide film. Because the field intensity between the drain region (D) and the gate electrode (G) is thereby relaxed, the breakdown voltage of the transistor can be increased.

The power terminal T21 is electrically connected to the P-type contact region 70a provided within the P-plug 70, and supplies a potential to the P-plug 70 and the first region 10a of the semiconductor substrate that includes the P-type buried diffusion layer 60. The power terminal T22 is electrically connected to the P-type contact region 90a provided in the P-plug 90, and supplies a potential to the P-plug 90 and the second region 10b of the semiconductor substrate that includes the P-type buried diffusion layer 80. The power terminal T23 is electrically connected to the N-type contact region 30a provided within the N-plug 30, and supplies a potential to the N-plug 30 and the N-type buried diffusion layer 20.

The power terminals T24 to T27 are respectively electrically connected to the drain regions (D) of the transistors QL1 to QL4 provided in the N-wells 45 to 48, and supply potentials to the drain regions (D) of the transistors QL1 to QL4. The body terminals TB1 to TB4 are respectively electrically connected to the P-type contact regions provided within the body regions (B) of the transistors QL1 to QL4, and supply potentials to the body regions (B) of the transistors QL1 to QL4.

Next, exemplary potentials that are supplied to respective parts of the semiconductor device shown in FIGS. 4A and 4B will be described. By applying a reference potential (0V) to the power terminal T22, the reference potential is supplied to the second region 10b of the semiconductor substrate from the power terminal T22. By applying a first potential (e.g., +2V) that is greater than or equal to the reference potential to the power terminal T23, the first potential is supplied to the N-plug 30 and the N-type buried diffusion layer 20 from the power terminal T23. By applying a second potential (e.g., −58V) that is less than the first potential to the power terminal T21, the second potential is supplied to the first region 10a of the semiconductor substrate from the power terminal T21.

By applying a third potential (e.g., ≤+50V) that is greater than the second potential to the power terminal T24, the third potential is supplied to the drain of the transistor QL1 and the N-well 45 from the power terminal T24. The reference potential (0V), for example, is supplied to the body terminal TB1 of the transistor QL1. In this case, the transistor QL1 operates in a voltage range of 0V to +50V that is greater than or equal to the reference potential.

By applying a fourth potential (e.g., +20V) that is greater than the second potential to the power terminal T25, the fourth potential is supplied to the drain of the transistor QL2 and the N-well 46 from the power terminal T25. The reference potential (0V), for example, is supplied to the body terminal TB2 of the transistor QL2. In this case, the transistor QL2 operates in a voltage range of 0V to +20V that is greater than or equal to the reference potential.

By applying a fifth potential (e.g., −50V) that is greater than the second potential to the power terminal T26, the fifth potential is supplied to the drain of the transistor QL3 and the N-well 47 from the power terminal T26. The second potential (−58V), for example, is supplied to the body terminal TB3 of the transistor QL3. In this case, the transistor QL3 operates in a voltage range of −50V to −58V that is less than or equal to the reference potential.

By applying a sixth potential (e.g., −20V) that is greater than the second potential to the power terminal T27, the sixth potential is supplied to the drain of the transistor QL4 and the N-well 48 from the power terminal T27. The second potential (−58V), for example, is supplied to the body terminal TB4 of the transistor QL4. In this case, the transistor QL4 operates in a voltage range of −20V to −58V that is less than or equal to the reference potential.

Although examples using a P-type semiconductor substrate were described in the above embodiments, an N-type semiconductor substrate may be used. Furthermore, the invention can be applied not only to a semiconductor device that is provided with N-channel LDMOS field-effect transistors but also to a semiconductor device that is provided with P-channel LDMOS field-effect transistors. The invention is thus not limited to the embodiments described above, and a person with ordinary skill in the art will appreciate that numerous modifications can be made without departing from the technical concept of the invention.

What is claimed is:

1. A semiconductor device comprising:
    a semiconductor substrate of a first conductivity type;
    an impurity layer of a second conductivity type disposed within the semiconductor substrate;
    an impurity region of the second conductivity type that is connected to the impurity layer within the semiconductor substrate, the impurity region and the impurity layer separating a first region of the semiconductor substrate from a second region of the semiconductor substrate by surrounding the first region of the semiconductor substrate;
    a first well and a second well of the second conductivity type disposed in the first region of the semiconductor substrate and separated from the impurity layer by at least a semiconductor layer of the first conductivity type; and
    a plurality of transistors disposed in the semiconductor substrate.

2. The semiconductor device according to claim 1, further comprising:
    a first terminal that supplies a potential to the first region of the semiconductor substrate; and
    a second terminal that supplies a potential to the second region of the semiconductor substrate.

3. The semiconductor device according to claim 2, further comprising a third terminal that supplies a potential to the impurity region and the impurity layer.

4. The semiconductor device according to claim 2, further comprising a fourth terminal that supplies a potential to the first well or the second well.

5. The semiconductor device according to claim 2, further comprising a third well of the first conductivity type disposed in the first region of the semiconductor substrate and separated from the impurity layer by at least the first conductivity type semiconductor layer.

6. The semiconductor device according to claim 5, wherein the first terminal is electrically connected to the third well, and a potential is supplied to the first region of the semiconductor substrate from the first terminal via the third well.

7. The semiconductor device according to claim 1, wherein a reference potential is supplied to the second region of the semiconductor substrate of a P-type, a first potential that is greater than or equal to the reference potential is supplied to the impurity region and impurity layer of an N-type,
a second potential that is less than the first potential is supplied to the first region of the P-type semiconductor substrate, and
a potential that is greater than the second potential is supplied to the first and second wells of the N-type.

8. The semiconductor device according to claim 7, wherein a second potential that is less than the reference potential is supplied to the first region of the P-type semiconductor substrate.

9. The semiconductor device according to claim 7, wherein a potential that is greater than the reference potential is supplied to the N-type first well, and a potential that is less than or equal to the reference potential is supplied to the N-type second well.

10. The semiconductor device according to claim 1, wherein the first conductivity type semiconductor layer within the first region of the semiconductor substrate includes a second impurity layer of the first conductivity type that is disposed on the impurity layer and contacts at least the first and second wells.

11. A semiconductor device comprising:
a semiconductor substrate of a first conductivity type;
an impurity layer of a second conductivity type disposed within the semiconductor substrate;
an impurity region of the second conductivity type that is connected between the impurity layer and a surface of the semiconductor substrate, the impurity region and the impurity layer surrounding a first region of the semiconductor substrate separating the first region from a second region of the semiconductor substrate;
a first terminal that supplies a first potential to the first region of the semiconductor substrate;
a second terminal that supplies a second potential to the second region of the semiconductor substrate;
a third terminal that supplies a third potential to the impurity region and the impurity layer;
a first transistor disposed in the first region; and
a second transistor disposed in the second region.

12. The semiconductor device according to claim 11, wherein:
the semiconductor substrate is P-type,
the third potential is greater than or equal to the second potential, and
the first potential is less than the third potential.

* * * * *